United States Patent
Kawashima et al.

(10) Patent No.: US 10,340,356 B2
(45) Date of Patent: Jul. 2, 2019

(54) LAMINATED ARTICLE

(71) Applicant: IDEMITSU KOSAN CO., LTD., Tokyo (JP)

(72) Inventors: Emi Kawashima, Chiba (JP); Takashi Sekiya, Chiba (JP); Yuki Tsuruma, Chiba (JP); Yoshihiro Ueoka, Chiba (JP); Shigekazu Tomai, Chiba (JP); Motohiro Takeshima, Chiba (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 0 days.

(21) Appl. No.: 16/065,943

(22) PCT Filed: Dec. 26, 2016

(86) PCT No.: PCT/JP2016/088764
§ 371 (c)(1),
(2) Date: Jun. 25, 2018

(87) PCT Pub. No.: WO2017/111173
PCT Pub. Date: Jun. 29, 2017

(65) Prior Publication Data
US 2019/0013389 A1  Jan. 10, 2019

(30) Foreign Application Priority Data

Dec. 25, 2015  (JP) .................. 2015-254556
Aug. 15, 2016  (JP) .................. 2016-159353

(51) Int. Cl.
*H01L 29/872* (2006.01)
*H01L 29/47* (2006.01)
(Continued)

(52) U.S. Cl.
CPC .............. *H01L 29/47* (2013.01); *H01L 21/28* (2013.01); *H01L 29/24* (2013.01); *H01L 29/247* (2013.01);
(Continued)

(58) Field of Classification Search
CPC .. H01L 29/872; H01L 29/47; H01L 29/66143
See application file for complete search history.

(56) References Cited

U.S. PATENT DOCUMENTS

2003/0015708 A1* 1/2003 Parikh .................. H01L 29/475
257/73
2011/0101355 A1  5/2011 Yamazaki
(Continued)

FOREIGN PATENT DOCUMENTS

JP  2008177537 A   7/2008
JP  2010225914 A  10/2010
(Continued)

OTHER PUBLICATIONS

International Search Report PCT/JP2016/088764 (WO2017111173A1) dated Mar. 7, 2017.
(Continued)

*Primary Examiner* — Nicholas J Tobergte
(74) *Attorney, Agent, or Firm* — Millen White Zelano and Branigan, PC; John Sopp

(57) ABSTRACT

A laminated body comprising a substrate, an ohmic electrode layer, a metal oxide semiconductor layer, a Schottky electrode layer and a buffer electrode layer in this order, wherein a reduction suppressing layer is provided between the Schottky electrode layer and the buffer electrode layer.

22 Claims, 6 Drawing Sheets

1. Laminated body
- 60: Buffer electrode layer
- 50: Reduction suppressing layer
- 40: Schottky electrode layer
- 30: Metal oxide semiconductor layer
- 20: Ohmic electrode layer
- 9: Substrate

(51) Int. Cl.
*H01L 21/28* (2006.01)
*H01L 29/868* (2006.01)
*H01L 29/24* (2006.01)
*H01L 29/66* (2006.01)
*H01L 29/06* (2006.01)

(52) U.S. Cl.
CPC .......... *H01L 29/868* (2013.01); *H01L 29/872* (2013.01); *H01L 29/0619* (2013.01); *H01L 29/0649* (2013.01); *H01L 29/66143* (2013.01)

(56) References Cited

U.S. PATENT DOCUMENTS

| | | |
|---|---|---|
| 2013/0126894 A1 | 5/2013 | Parikh |
| 2015/0325660 A1 | 11/2015 | Hitora |
| 2016/0372609 A1* | 12/2016 | Kiyama ................ H01L 29/872 |
| 2017/0162655 A1 | 6/2017 | Takizawa |
| 2017/0263786 A1 | 9/2017 | Tomai |

FOREIGN PATENT DOCUMENTS

| | | | |
|---|---|---|---|
| JP | 2013102081 A | 5/2013 |
| JP | 201584439 A | 4/2015 |
| JP | 2015109315 A | 6/2015 |
| JP | 2015227279 A | 12/2015 |
| WO | 2015025499 A1 | 2/2015 |

OTHER PUBLICATIONS

IEEE Transaction on Electron Devices, vol. 60, No. 10, Oct. 2013, p. 3407.

* cited by examiner

1. Laminated body
- 60: Buffer electrode layer
- 50: Reduction suppressing layer
- 40: Schottky electrode layer
- 30: Metal oxide semiconductor layer
- 20: Ohmic electrode layer
- 9: Substrate 2. Laminated body
- 60:
- 50:
- 40:
- 30:
- 20:
- 9:

LAMINATED ARTICLE

TECHNICAL FIELD

The invention relates to a laminated body, a semiconductor device, a Schottky barrier diode, a junction transistor, an electronic circuit, an electric apparatus, an electronic apparatus, a vehicle and a power engine.

BACKGROUND ART

A Schottky barrier diode is a diode having a rectifying function utilizing a potential barrier formed on the junction surface of a Schottky metal having a sufficiently high carrier concentration and a semiconductor. For example, when the work function of the metal is taken as φm and the work function of the n-type semiconductor is taken as φs (where the work function of the semiconductor is defined as the difference between the vacuum level and the Fermi level), if a metal and a semiconductor that satisfy relationship $|\varphi m|>|\varphi s|$ are brought into contact with each other, electrons present near the contact interface of the semiconductor move towards the metal so that the Fermi level of the metal coincides with the Fermi level of the semiconductor, and a depletion region is formed at the contact interface of the semiconductor, and at the same time, a potential barrier is formed at the metal-semiconductor interface. In this case, it is a diode with a metal side as a positive electrode and a semiconductor side as a negative electrode. At the time of application of forward bias, the potential barrier lowers, and electrons flow across the barrier, whereby current flows. At the time of application of reverse bias, electrons are blocked by the potential barrier and current flow is blocked. As the semiconductor, Si is most commonly used.

A Si-based Schottky diode is used in a high-speed switching device, a transmission/receiving mixer in a several GHz frequency band, a frequency conversion device or the like. It is generally used for power semiconductors. Since it has a small band gap of 1.1 eV and a small dielectric breakdown field of 0.3 MV/cm, there is a disadvantage that it is required to increase the thickness of the device in order to allow it to have a large withstand voltage, leading to an increase in forward on-resistance. In addition, a Si-based Schottky barrier diode having a high-speed response has an insufficient withstand voltage.

A Schottky diode utilizing SiC is also known. SiC has a large band gap of 3 eV or more and has a large dielectric breakdown field of 3 MV/cm. Therefore, a SiC-based Schottky diode is suited to power semiconductors, and active studies have been made on application of a SiC-based Schottky diode to power semiconductors. However, since it is difficult to fabricate a good crystal substrate, and epitaxial growth requires high-temperature processes, use of SiC has problems in respect of mass productivity and cost.

$\beta$-$Ga_2O_3$ has a further wider band gap (4.8 eV to 4.9 eV), and hence, is expected to have a high withstand voltage. However, it has a problem in producing a good substrate as well as in mass productivity and cost.

An oxide semiconductor has a wide band gap as compared with Si and has a high dielectric breakdown field, and therefore, it is expected to be applied to power semiconductors. In particular, a Schottky barrier diode is expected to have a high-speed response and excellent reverse recovery characteristics.

Non-Patent Document 1 discloses a Schottky barrier diode in which amorphous IGZO is used as an oxide semiconductor and a Ti/Pd laminated body is used as a Schottky metal electrode. In this technology, by subjecting Pd to an oxygen plasma treatment, an excellent Schottky barrier is formed. However, this technology is a diode in which current is extracted in the lateral direction, and it was difficult to extract large current due to resistance of an extraction electrode. Further, the electrode positioned at the lower end of the oxide semiconductor layer plays a role of a Schottky electrode, and the conduction direction is opposite to that of a Schottky barrier diode using common Si or SiC. When incorporating this Schottky barrier diode in a conventional electronic circuit, there was a problem in compatibility with other electronic materials. Also in the case of extracting the current in the lateral direction, in this technology, leakage current in the reverse direction is large. Therefore, when this is incorporated into an electronic circuit in which a Schottky barrier diode is used, there is a concern that power loss at the time of output becomes large as compared with the input power or a circuit itself malfunctions.

Patent Document 1 discloses a Schottky barrier diode in which a $Ga_2O_3$-based compound semiconductor is used as an oxide semiconductor layer and the oxide semiconductor layer is disposed between an ohmic electrode layer and a Schottky electrode layer. However, if a $Ga_2O_3$-based semiconductor layer is formed on a silicon substrate, for example, a forward on-resistance is increased, and when this is incorporated into an electric circuit in which a Schottky barrier diode is used, power loss at the time of output becomes large as compared with input power.

Patent Document 2 discloses a technology in which a gate electrode and a source or drain electrode of FET using an oxide semiconductor are electrically connected, realizing a diode having a small reverse saturated current. However, by this method, the device structure becomes complicated, resulting in poor yield when fabricated into a device.

RELATED ART DOCUMENTS

Patent Documents

Patent Document 1: JP-A-2013-102081
Patent Document 2: JP-A-2015-84439

Non-Patent Document

Non-Patent Document 1: IEEE TRANSACTION ON ELECTRON DEVICES, Vol. 60, No. 10, OCTOBER 2013, p. 3407

SUMMARY OF THE INVENTION

An object of the invention is to provide a semiconductor device that has a small forward on-resistance, a small reverse leakage current, and that enables current to be extracted with only a small power loss, as well as a laminated body used in such a semiconductor device.

According to the invention, the following laminated body or the like are provided.
1. A laminated body comprising a substrate, an ohmic electrode layer, a metal oxide semiconductor layer, a Schottky electrode layer and a buffer electrode layer in this order, wherein
a reduction suppressing layer is provided between the Schottky electrode layer and the buffer electrode layer.
2. The laminated body according to 1, wherein the reduction suppressing layer comprises one or more elements selected from the group consisting of Pd, Mo, Pt, Ir, Ru, Au, Ni, W, Cr, Re, Te, Tc, Mn, Os, Fe, Rh and Co.

3. The laminated body according to 1 or 2, wherein the Schottky electrode layer comprises an oxide of one or more metal elements having a work function of 4.4 eV or more.

4. The laminated body according to any one of 1 to 3, wherein the Schottky electrode layer comprises an oxide of one or more metals selected from the group consisting of Pd, Mo, Pt, Ir, Ru, Ni, W, Cr, Re, Te, Tc, Mn, Os, Fe, Rh and Co.

5. The laminated body according to any one of 1 to 4, wherein the substrate is a conductive substrate.

6. The laminated body according to any one of 1 to 4, wherein the substrate is an insulating substrate.

7. The laminated body according to any one of 1 to 4, wherein the substrate is a semiconductor substrate.

8. The laminated body according to any one of 1 to 4, which comprises a layer structure comprising one or more layers selected from the group consisting of an electrode layer and an insulating layer.

9. The laminated body according to any one of 1 to 4, wherein the substrate is a conductive silicon substrate.

10. The laminated body according to any one of 1 to 9, wherein the metal oxide semiconductor layer comprises one or more elements selected from the group consisting of In, Ga, Zn and Sn.

11. The laminated body according to any one of 1 to 10, wherein the hydrogen atom concentration of the metal oxide semiconductor layer is $10^{17}/cm^3$ or more and $10^{22}/cm^3$ or less.

12. The laminated body according to any one of 1 to 11, wherein an outer edge of the metal oxide semiconductor layer is positioned on the same position as the position of an outer edge of the ohmic electrode layer or is positioned on the inside of an outer edge of the ohmic electrode layer, and the ohmic electrode layer is in contact with an entire lower surface of the metal oxide semiconductor layer.

13. The laminated body according to any one of 1 to 12, wherein an outer edge of the Schottky electrode layer is positioned on the same position as the position of an outer edge of the metal oxide semiconductor layer or is positioned on the inside of an outer edge of the metal oxide semiconductor layer.

14. A semiconductor device wherein the laminated body according to any one of 1 to 13 is used.

15. A Schottky barrier diode wherein the semiconductor device according to 14 is used.

16. A junction transistor wherein the semiconductor device according to 14 is used.

17. An electronic circuit wherein the semiconductor device according to 14, the Schottky barrier diode according to 15 or the junction transistor according to 16 is used.

18. An electric apparatus, an electronic apparatus, a vehicle or power engine wherein the electronic circuit according to 17 is used.

According to the invention, a semiconductor device that has a small forward on-resistance, a small reverse leakage current, and enables current to be extracted with small power loss, and a laminated body used therein are provided.

MODE FOR CARRYING OUT THE INVENTION

[Laminated Body]

The laminated body according to one aspect of the invention comprises an ohmic electrode layer, a metal oxide semiconductor layer, a Schottky electrode layer and a buffer electrode layer in this order, wherein a reduction suppressing layer is provided between the Schottky electrode layer and the buffer electrode layer.

In one aspect of the laminated body of the invention, a Schottky barrier diode can be formed on any substrate or on any base material.

There may be any layer disposed between the substrate and the ohmic electrode layer.

It is preferred that the ohmic electrode and the metal oxide semiconductor layer be in contact with each other, and it is preferred that the metal oxide semiconductor layer and the Schottky electrode layer be in contact with each other.

The laminated body according to another aspect of the invention comprises, on a conductive substrate, an ohmic electrode layer, a metal oxide semiconductor layer, a Schottky electrode layer and a buffer electrode layer in this order, wherein a reduction suppressing layer is provided between the Schottky electrode layer and the buffer electrode layer.

The laminated body according to one aspect of the invention and the laminated body according to another aspect of the invention are comprehensively referred to as the "laminated body of the invention".

Due to the above-mentioned configuration, the laminated body of the invention can have a small forward on-resistance when used in a semiconductor device. Further, reverse leakage current can be reduced, whereby current can be extracted with small power loss as compared with the input power.

As the layer configuration of the laminated body of the invention, the following configurations can be given.

Substrate//ohmic electrode layer/metal oxide semiconductor layer/Schottky electrode layer/reduction suppressing layer/buffer electrode layer ("/" means that the layers are stacked such that they are adjacent to each other) ("//" means that the layers are stacked such that they are adjacent to each other or without being adjacent to each other)

Figure 1:
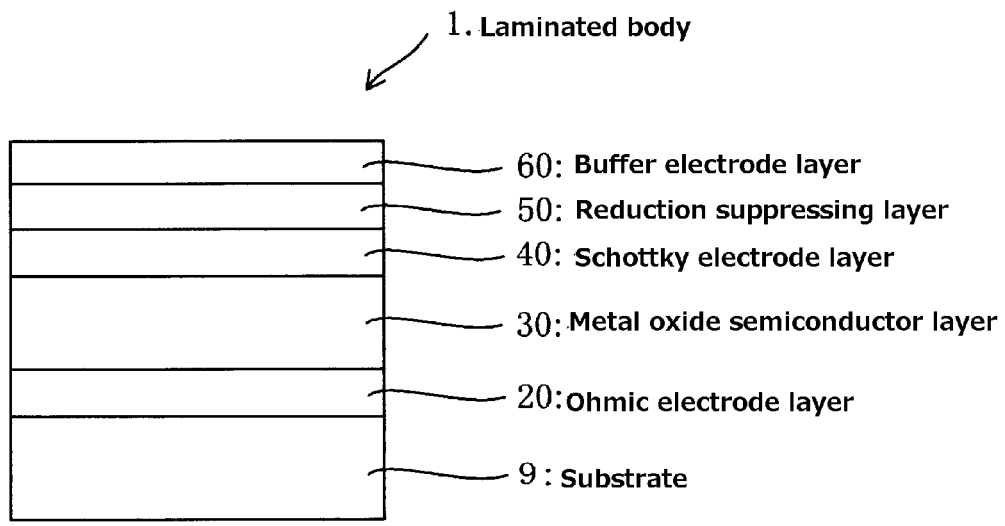
FIG. 1 is a schematic cross-sectional view showing one embodiment of the laminated body of the invention.

The layer structure according to one embodiment of the laminated body of the invention is shown in FIG. 1. In a laminated body 1, on a substrate 9, an ohmic electrode layer 20, a metal oxide semiconductor layer 30, a Schottky electrode layer 40, a reduction suppressing layer 50 and a buffer electrode layer 60 are stacked in this order.

Figure 2:
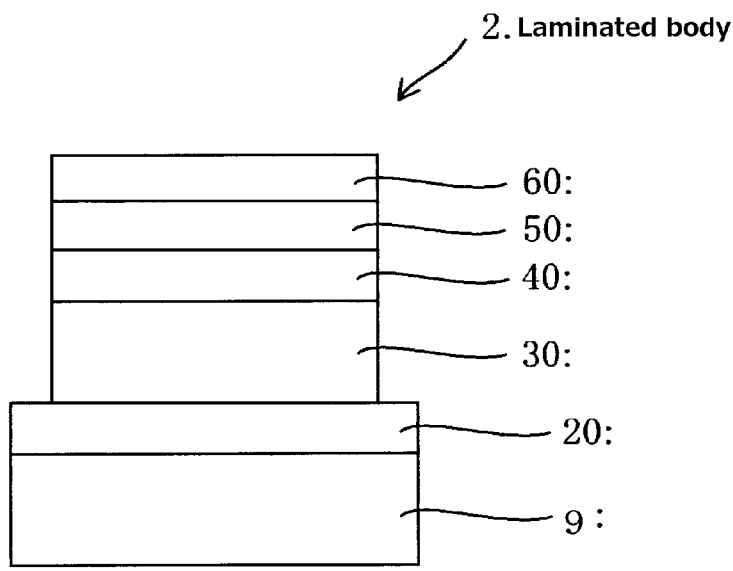
FIG. 2 is a schematic cross-sectional view showing another embodiment of the laminated body of the invention.

An outer edge (end part) of the metal oxide semiconductor layer 30 may be positioned on the same position as the position of an outer edge of the ohmic electrode layer 20 or may be positioned on the inside of an outer edge of the ohmic electrode layer 20. The latter case is shown in FIG. 2.

An outer edge (end part) of the metal oxide semiconductor layer 40 may be positioned on the same position as the position of an outer edge of the metal oxide semiconductor layer 30 or may be positioned on the inside of an outer edge of the metal oxide layer 30. The latter case is shown in FIG. 3.

Figure 3:
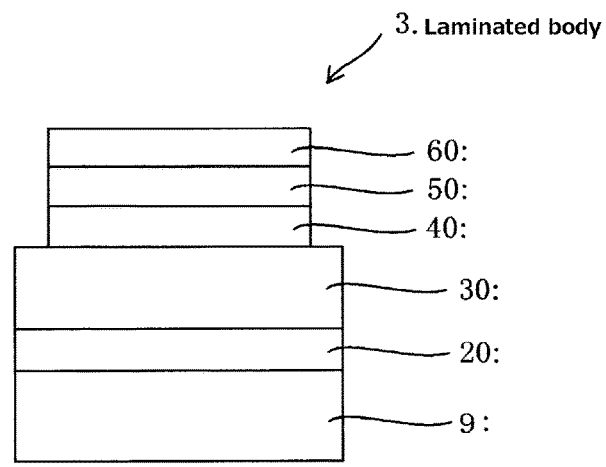
FIG. 3 is a schematic cross-sectional view showing another embodiment of the laminated body of the invention.
Figure 4:
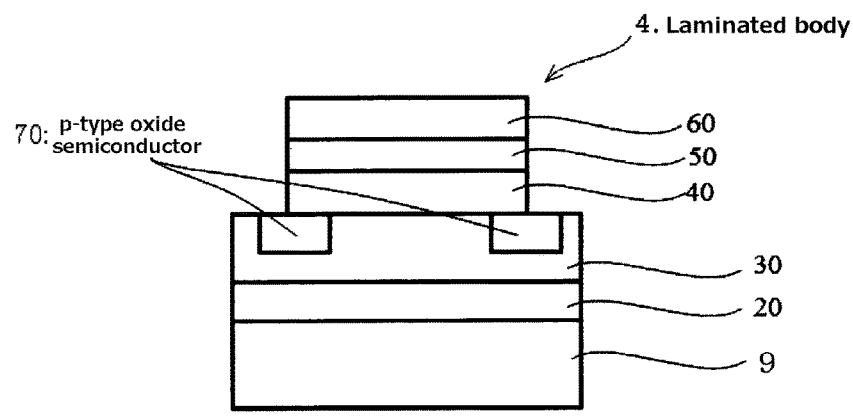
FIG. 4 is a schematic cross-sectional view showing another embodiment of the laminated body of the invention.

The laminated body shown in FIG. 4 is obtained by embedding a p-type oxide semiconductor 70 in part of the metal oxide semiconductor layer 30 of the laminated body shown in FIG. 3 such that it is in contact with the lower part of the both sides of the Schottky electrode layer 40.

Figure 5:
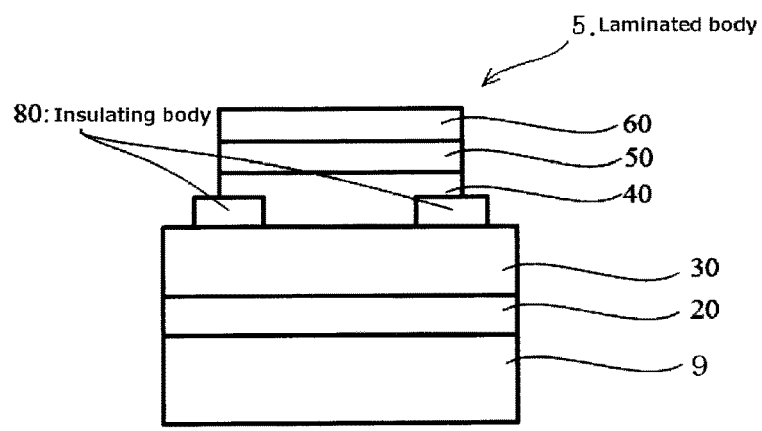
FIG. 5 is a schematic cross-sectional view showing another embodiment of the laminated body of the invention.

The laminated body shown in FIG. 5 is obtained by arranging an insulating body 80 in the both end parts of the Schottky electrode layer 40 as part thereof in the laminated body shown in FIG. 3.

Figure 6:
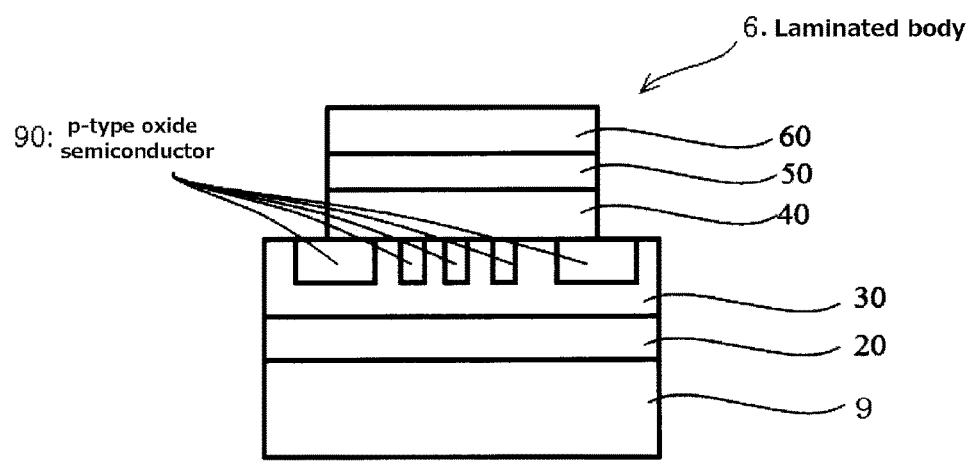
FIG. 6 is a schematic cross-sectional view showing another embodiment of the laminated body of the invention.

The laminated body shown in FIG. 6 is obtained by embedding, in a periodic manner, a p-type oxide semiconductor 90 in part of the metal oxide semiconductor layer 30 of the laminated body shown in FIG. 3 such that it contacts the lower part of the Schottky electrode layer 40.

Each configuration will be mentioned later.

Figure 7:
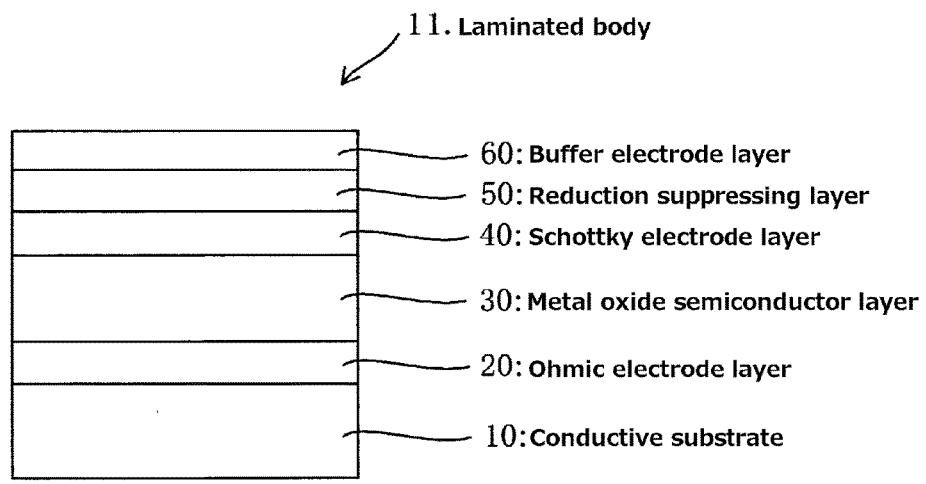
FIG. 7 is a schematic cross-sectional view showing another embodiment of the laminated body of the invention.

The laminated layer structure of the laminated body according to another embodiment of the invention is shown in FIG. 7. In a laminated body 11, on the conductive substrate 10, the ohmic electrode layer 20, the metal oxide semiconductor layer 30, the Schottky electrode layer 40, the reduction suppressing layer 50 and the buffer electrode layer 60 are stacked in this order.

Figure 8:
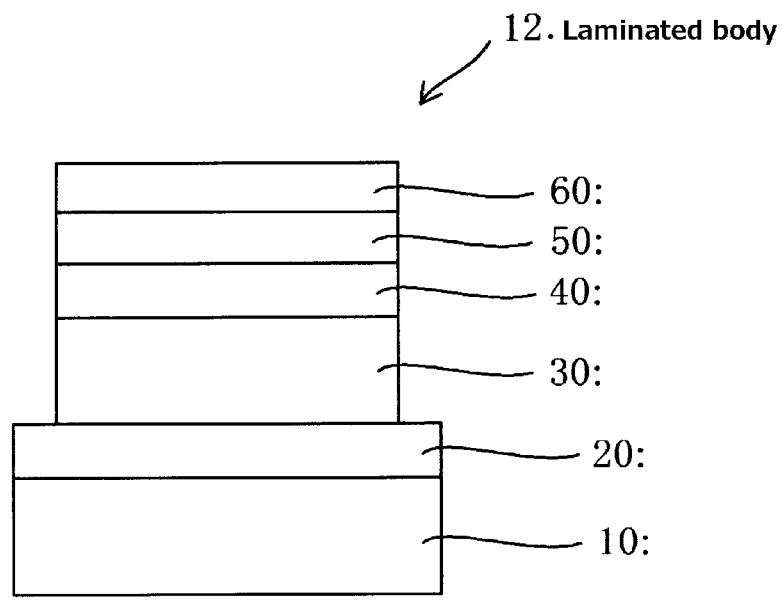
FIG. 8 is a schematic cross-sectional view showing another embodiment of the laminated body of the invention.

An outer edge (end part) of the metal oxide semiconductor layer 30 may be positioned on the same position as the position of an outer edge of the ohmic electrode layer 20 or may be positioned on the inside of an outer edge of the ohmic electrode layer 20. The latter case is shown in FIG. 8. In this case, a configuration in which the ohmic electrode layer 20 covers the lower surface of the metal oxide semiconductor layer 30, i.e. a configuration in which the entire lower surface of the metal oxide semiconductor layer 30 is in contact with the ohmic electrode layer 20, is realized.

Figure 9:
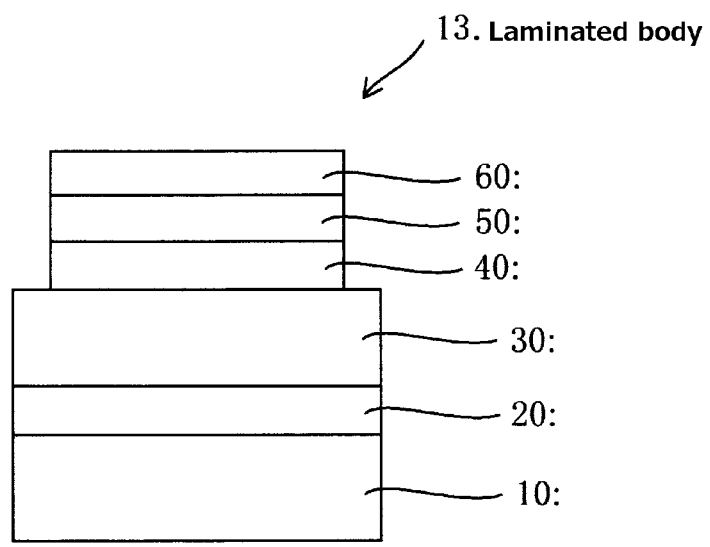
FIG. 9 is a schematic cross-sectional view showing another embodiment of the laminated body of the invention.

An outer edge of the Schottky electrode layer 40 may be positioned on the same position as the position of an outer edge of the metal oxide semiconductor layer 30 or may be positioned on the inside of an outer edge of the metal oxide semiconductor layer 30. The latter case is shown in FIG. 9. In this case, a configuration in which the metal oxide semiconductor layer 30 covers the lower surface of the Schottky electrode layer 40 is realized.

In a covalent crystalline semiconductor such as Si, in order to prevent current leakage, it is necessary to realize a structure in which an end part of the semiconductor is not directly in contact with the Schottky electrode. On the other hand, in a metal oxide semiconductor, leakage current at the end of the film is small, and hence, a configuration in which the end part of the metal oxide semiconductor layer is positioned on the same position as the position of the end part of the Schottky electrode layer or a configuration in which the Schottky electrode is positioned on the inside of the end part of the metal oxide semiconductor layer is realized.

Figure 10:
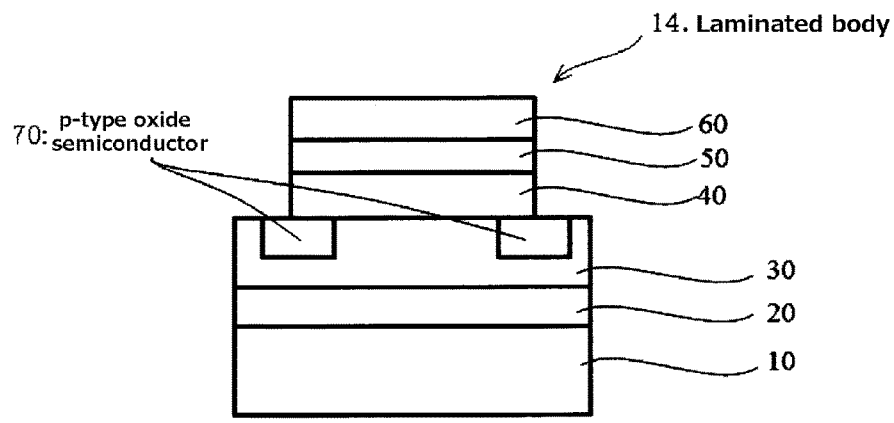
FIG. 10 is a schematic cross-sectional view showing another embodiment of the laminated body of the invention.
Figure 11:
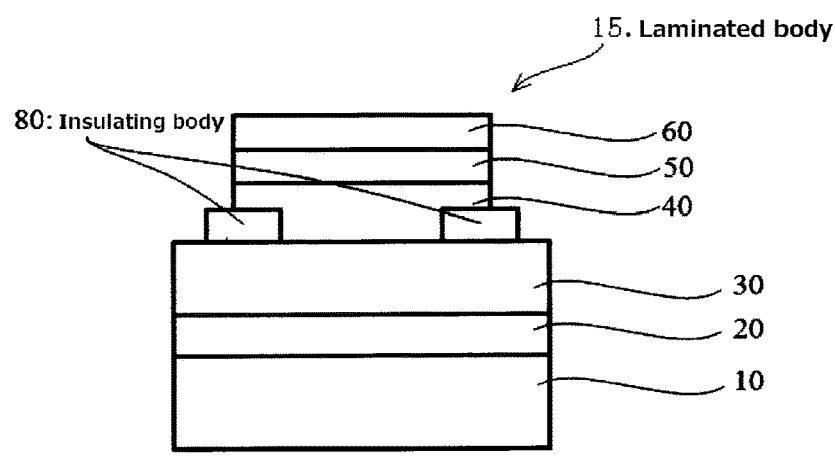
FIG. 11 is a schematic cross-sectional view showing another embodiment of the laminated body of the invention.
Figure 12:
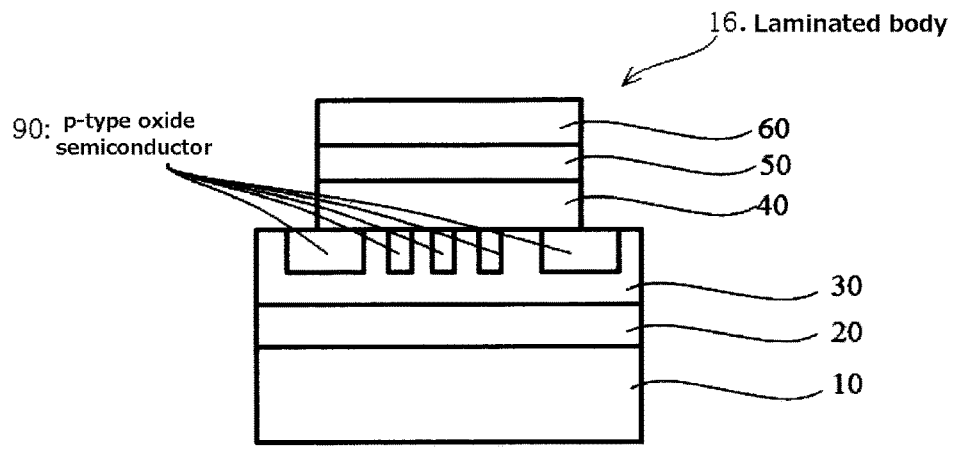
FIG. 12 is a schematic cross-sectional view showing another embodiment of the laminated body of the invention.

Other embodiments of the laminated layer structure of the laminated body of the invention are shown in FIGS. 10 to 12.

The laminated body shown in FIG. 10 is obtained by embedding the p-type oxide semiconductor 70 in part of the metal oxide semiconductor layer 30 of the laminated body shown in FIG. 9 such that it is in contact with the lower part of the both end parts of the Schottky electrode layer 40. Due to such a configuration, the end part of the Schottky electrode is not in direct contact with the n-type oxide semiconductor layer. As a result, when reverse bias is applied, concentration of electric field at the end part of the semiconductor layer can be prevented, whereby a high dielectric voltage can be realized. Therefore, it is possible to realize properties that consumed power relative to on-off of forward bias application is small can be realized.

Further, the laminated body shown in FIG. 11 is obtained by providing an insulating body 80 in the both end parts of the Schottky electrode layer 40 as part thereof in the laminated body shown in FIG. 9. Due to such a configuration, the end parts of the Schottky electrode are not in direct contact with the n-type oxide semiconductor layer. As a result, when reverse bias is applied, concentration of electric field at the end part of the semiconductor layer can be prevented, whereby a high dielectric voltage can be realized. Therefore, it is possible to realize properties that consumed power relative to on-off of forward bias application is small can be realized.

The laminated body shown in FIG. 12 is obtained by embedding, periodically, the p-type oxide semiconductor 90 in part of the metal oxide semiconductor layer 30 of the laminated body shown in FIG. 9 such that it contacts the lower part of the Schottky electrode layer 40. This configuration is obtained by a PiN diode and a Schottky barrier diode, and is called MPS (Merged PiN and Schottky Barrier) structure. It has an advantage that, due to the property of the PiN diode, the withstand voltage is increased, and due to the property of the Schottky barrier diode, the power consumption is lowered.

Any of the configurations in FIG. 2 and any of FIGS. 3 to 6 can be provided simultaneously.

Any of the configurations in FIG. 8 and any of FIGS. 9 to 12 can be provided simultaneously.

Figure 13:
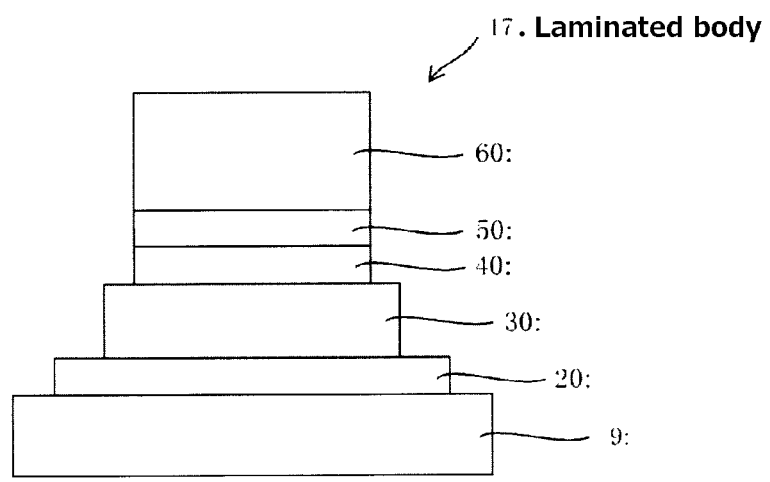
FIG. 13 is a schematic cross-sectional view showing another embodiment of the laminated body of the invention.

The laminated layer structure of the laminated body in which the configurations in FIG. 2 and FIG. 3 are simultaneously provided is shown in FIG. 13. Here, the outer edge of the substrate 9 is larger than the outer edge of the ohmic electrode layer 20.

Figure 14:
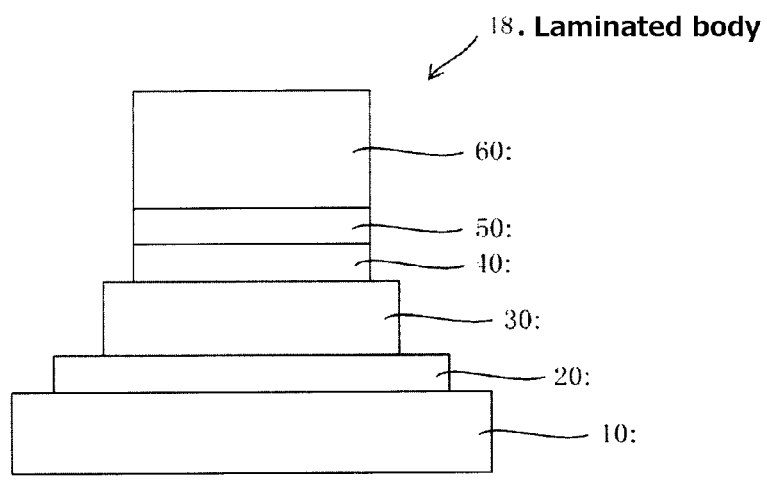
FIG. 14 is a schematic cross-sectional view showing another embodiment of the laminated body of the invention.

The laminated layer structure of the laminated body in which the configurations in FIG. 8 and FIG. 9 are simultaneously provided is shown in FIG. 14. Here, the outer edge of the conductive substrate 10 is larger than the outer edge of the ohmic electrode layer 20.

Hereinbelow, an explanation will be given on each layer constituting the laminated body of the invention.

(Substrate)

No particular restrictions are made on a substrate, and known substrates can be used. As the substrate, a conductive substrate, a semiconductor substrate, an insulating substrate or the like can be given.

As the conductive substrate, a silicon substrate or a metal substrate can be given. A preferable substrate is a low-resistance silicon substrate having a high concentration of doped impurities. A n-type low-resistance silicon substrate is more preferable. As the dopant, conventionally known B, P, Pb, As or the like can be used.

It is preferred that a silicon substrate have a low resistance. The volume resistivity ρ of the silicon substrate is preferably 100 mΩcm or less, more preferably 10 mΩcm or less, with 5 mΩcm or less being further preferable.

As the metal of the metal substrate, Cu, Al, Au, Cr, Fe, Ni, W or the like can be given, and an alloy thereof can also be used. Cu, Al or an alloy thereof which has a low resistance, is available at a low cost and has excellent heat conductance is preferable.

The laminated body of the invention can provide a Schottky barrier diode that exhibits preferable diode properties even when a cheap silicon substrate or a metal substrate is used as a conductive substrate.

The thickness of the conductive substrate is normally 200 μm to 2 mm.

On the back surface of the conductive substrate, an electrode layer (back electrode) may be laminated. No specific restrictions are imposed on the back electrode, Ti, Ni, Au, Cu, Al, Cr, Fe, Ni, W or the like or a laminated layer structure thereof, and an alloy thereof can be given.

No particular restrictions are imposed on materials for the semiconductor substrate as long as the surface smoothness is kept.

As the semiconductor substrate, a Si substrate, a GaN substrate, a SiC substrate, a GaP substrate, a GaAs substrate, a ZnO substrate, a $Ga_2O_3$ substrate, a GaSb substrate, an InP substrate, an InAs substrate, an InSb substrate, a ZnS substrate, a ZnTe substrate, a diamond substrate or the like, of which the carrier concentration is adjusted to be $1\times10^{18}$ $cm^{-3}$ or less can be given.

A semiconductor substrate may be monocrystalline or polycrystalline. It may be an amorphous substrate or a partially amorphous substrate. A substrate on which a semiconductor film is formed using a technique such as CVD (Chemical Vapor Deposition) or the like may be used on a conductor substrate, a semiconductor substrate, and an insulating substrate may be used.

The surface roughness of the semiconductor substrate is not particularly restricted, but is preferably 150 nm or less, more preferably 50 nm or less, and further preferably 10 nm or less. The surface roughness is measured by the method described in the Examples.

A substrate having a small surface roughness and having a high degree of surface smoothness enables the smoothness of the Schottky electrode layer to be kept when the contact resistance reducing layer, the reduction suppressing layer and the Schottky electrode layer are stacked, whereby the reverse leakage current when fabricated as a device can be suppressed.

The thickness of the semiconductor substrate is normally 200 μm to 2 mm. The thickness of the semiconductor substrate is preferably 200 μm to 1 mm, and more preferably 200 μm to 700 μm. By allowing the thickness to be 200 μm to 2 mm, processability at the time of dicing after fabrication of a device is improved, the yield of the device is enhanced, whereby productivity tends to be improved.

No specific restrictions are imposed on the insulating substrate as long as it is a substrate having insulating properties. Within a range that the advantageous effects of the invention are not impaired, a commonly used substrate can be arbitrary selected.

As the insulating substrate, for example, an alkali-free glass substrate such as quartz glass, barium borosilicate glass, aluminoborosilicate glass, aluminosilicate glass or the like, which are manufactured by a fusion method or a float method, a ceramic substrate and a plastic substrate (e.g. polyimide substrate) that has a heat resistance that can withstand the processing temperature of this fabrication process can be given.

Further, as the insulating substrate, a dielectric substrate may also be used.

As the dielectric substrate, a lithium niobate substrate, a lithium tantalate substrate, a zinc oxide substrate, a quartz substrate, a sapphire substrate or the like can be given.

Further, an insulating substrate and a dielectric substrate in which an insulating film or a dielectric film is provided on the surface of a metal substrate such as stainless alloy may be used.

Further, an insulating film may be formed as the base film on the substrate. As the base film, a single layer or a stacked layer of a silicon oxide film, a silicon nitride film, a silicon oxynitride film, a silicon nitrided oxide film or the like can be formed.

The surface roughness of the insulating substrate is not particularly restricted, but is preferably 150 nm or less, more preferably 50 nm or less, and further preferably 20 nm or less. The surface roughness is measured by the methods described in the Examples.

If the surface roughness of the substrate is small and the surface smoothness is large, when the contact resistance reducing layer, the reduction suppressing layer and the Schottky electrode layer are stacked, the smoothness of the Schottky electrode layer is maintained, and when fabricating into a device, reverse leakage current can be suppressed low.

The thickness of the insulating substrate is not particularly restricted, but is 2 μm to 2 mm, preferably, 2 μm to 1 mm, and more preferably 2 μm to 700 μm. By allowing the thickness of the insulting substrate to be 2 μm to 2 mm, processability at the time of dicing after fabrication of a device is improved, the yield of the device is enhanced, whereby productivity tends to be improved.

On the conductive substrate, the semiconductor substrate or the insulating substrate, a base material having an arbitrary structure composed of a plurality of materials, a layer structure, a circuit, a wiring, an electrode or the like may be used.

As the material of the arbitrary structure, various composite materials of metals and insulating products such as a metal and an interlayer insulating film forming a back end of line of a large-scale integrated circuit (LSI) or the like can be given.

The layers of the layer structure are not particularly restricted, and known layers such as an electrode layer, an insulating layer, a semiconductor layer, a dielectric layer, a protective film layer, a stress buffer layer, a light shielding layer, an electron/hole-injecting layer, an electron/hole-transporting layer, a light emitting layer, an electron/hole-blocking layer, a crystal growth layer, an adhesion-improving layer, a memory layer, a liquid crystal layer, a capacitor layer, a power storage layer or the like can be used.

As the electrode layer, in general, an Al layer, a Si layer, a Sc layer, a Ti layer, a V layer, a Cr layer, a Ni layer, a Cu layer, a Zn layer, a Ga layer, a Ge layer, a Y layer, a Zr layer, a Nb layer, a Mo layer, a Tc layer, a Ru layer, a Rh layer, a Pd layer, an Ag layer, a Cd layer, an In layer, a Sn layer, a Sb layer, a Te layer, a Hf layer, a Ta layer, a W layer, a Re layer, an Os layer, an Ir layer, a Pt layer, an Au layer, an alloy layer containing one or more of the metals in these layers, an oxide electrode layer or the like can be given. It is possible to increase the carrier density of the semiconductor such as an oxide semiconductor or Si, and to use the semiconductor in the electrode layer.

As the insulating layer, in general, an oxide insulating film, a nitride film or the like, containing one or more metals selected from the group consisting of Al, Si, Sc, Ti, V, Cr, Ni, Cu, Zn, Ga, Ge, Y, Zr, Nb, Mo, Tc, Ru, Rh, Pd, Ag, Cd, In, Sn, Sb, Te, Hf, Ta, W, Re, Os, Ir, Pt and Au can be given.

As the semiconductor layer, a wide variety of layers can be given irrespective of the crystal state, i.e., being monocrystalline, polycrystalline or amorphous. Examples thereof include an oxide semiconductor layer such as a Si layer, a GaN layer, a SiC layer, a GaP layer, a GaAs layer, a GaSb layer, an InP layer, an InAs layer, an InSb layer, a ZnS layer, a ZnTe layer, a diamond layer, a $Ga_2O_3$, a ZnO, an InGaZnO, and an organic semiconductor layer such as pentacene.

As the dielectric layer, a lithium niobate layer, a lithium tantalate layer, a zinc oxide layer, a quartz substrate layer, a sapphire layer, a $BaTiO_3$ layer, a $Pb(Zr,Ti)O_3$(PZT) layer, a (Pb,La)(Zr,Ti)$O_3$ (PLZT) layer, a $Pb(Zr,Ti,Nb)O_3$ (PZTN) layer, a $Pb(Ni,Nb)O_3$—$PbTiO_3$ (PNN-PT) layer, a Pb(Ni,Nb)$O_3$—$PbZnO_3$ (PNN-PZ) layer, a $Pb(Mg,Nb)O_3$—$PbTiO_3$ (PMN-PT) layer, a $SrBi_2Ta_2O_9$ (SBT) layer, a (K,Na)$TaO_3$ layer, a (K,Na)$NbO_3$ layer, a $BiFeO_3$ layer, a Bi(Nd, La)TiO$_x$ layer (x=2.5 to 3.0), a HfSiO(N) layer, a $HfO_2$—$Al_2O_3$ layer, a $La_2O_3$ layer, a $La_2O_3$—$Al_2O_3$ layer or the like can be given.

As the film of the protective film layer, a film improved in insulating properties irrespective of being inorganic or organic, and has low transmission of water or the like can be given. As the protective film layer, a $SiO_2$ layer, a SiNx layer (x=1.20 to 1.33), a SiON layer, an $Al_2O_3$ layer or the like can be given.

As the stress buffer layer, an AlGaN layer or the like can be given.

As the light-shielding layer, for example, a black matrix layer containing a metal, a metal-organic material or the like, a color filter layer can be mentioned.

Examples of the electron/hole-injecting layer include an oxide semiconductor layer, an organic semiconductor layer or the like.

Examples of the electron/hole-transporting layer include an oxide semiconductor layer, an organic semiconductor layer or the like.

As the light emitting layer, an inorganic semiconductor layer, an organic semiconductor layer or the like can be given.

As the electron/hole-blocking layer, an oxide semiconductor layer or the like can be given.

Examples of the base material include a power generation device, a light-emitting device, a sensor, a power conversion device, a calculation device, a protection device, an optoelectronic device, a display, a memory, a semiconductor device having a back end of line, a power storage device, or the like.

The layer of the layer structure may be a single layer or a stacked layer of 2 or more layers.

(Ohmic Electrode Layer)

No specific restrictions are imposed on the material of the ohmic electrode layer as long as good ohmic contact can be attained with the metal oxide semiconductor layer. One having a contact resistance of 10 mΩcm or less with the substrate is preferable.

As the material of the ohmic electrode layer, one or more elements selected from the group consisting of Ti, Mo, Ag, In, Al, W, Co and Ni or an alloy thereof can be given. One or more elements selected from the group consisting of Ti, Mo, Ag, In and Al that form low-resistance silicides or alloys thereof are preferable.

The thickness of the ohmic electrode layer is not particularly restricted, but is normally 2 nm to 1 µm, preferably 5 to 300 nm. Within this range, the layer has sufficient adhesiveness and increases in resistance only slightly.

Further, it is possible to constitute the ohmic electrode layer from a plurality of layers.

The ohmic electrode layer can be confirmed by a cross-sectional TEM observation or a secondary ion mass spectrometry. The same is applied to a substrate, a buffer electrode layer, a metal oxide semiconductor layer, a Schottky electrode layer and a reduction suppressing layer.

(Metal Oxide Semiconductor Layer)

The composition of the metal oxide semiconductor layer is not particularly restricted, as long as it is a metal oxide semiconductor. An oxide containing one or more elements selected from In, Ga, Zn and Sn is preferable. For example, an oxide semiconductor of In, Ga and Zn (IGZO), an oxide semiconductor of In, Sn and Zn, an oxide semiconductor of In and Ga, an oxide semiconductor of In, or the like can be given.

Further, no restrictions are imposed on crystallinity. Any of a layer formed of an amorphous oxide semiconductor, a layer formed of a polycrystalline oxide semiconductor, a layer formed of a monocrystalline oxide semiconductor layer or a layer formed of a mixture thereof can be used.

The concentration of a hydrogen atom in the metal oxide semiconductor layer is preferably $10^{17}/cm^3$ or more and $10^{22}/cm^3$ or less. If the hydrogen atom becomes larger than this, an In—O network of an oxide is not formed, whereby bonding may become instable. The concentration of a hydrogen atom is preferably $10^{17}$ to $10^{22}/cm^3$, more preferably $10^{19}$ to $10^{22}/cm^3$ and further preferably $10^{20}$ to $10^{21}/cm^3$.

An oxide semiconductor tends to form an oxygen deficiency easily, and current may leak through the deficiency. By increasing the concentration of hydrogen atoms in the film to $10^{20}/cm^3$ or more, it is possible to terminate the oxygen deficiency with a hydroxyl group, thus reducing leakage current.

The concentration of hydrogen atoms is measured by secondary ion mass spectrometry. The method for adjusting the concentration of hydrogen atoms is not particularly restricted. However, it can be adjusted by optimizing the atmosphere of the apparatus at the time of film formation, the annealing after the film formation and the atmosphere at the time of film formation of a Schottky electrode.

The band gap of the metal oxide semiconductor layer is preferably 2.0 eV to 6.0 eV, more preferably 2.5 eV to 5.5 eV, and further preferably 3.0 eV to 5.0 eV. The band gap is measured by the method described in the Examples. By using the metal oxide semiconductor layer having a band gap in this range, it is possible to obtain a device having a low on-resistance.

The free carrier concentration of the metal oxide semiconductor layer is normally $1 \times 10^{13}$ $cm^{-3}$ or more and less than $1 \times 10^{18}$ $cm^{-3}$. The free carrier concentration is measured by the method described in the Examples.

The thickness of the metal oxide semiconductor layer is normally 10 nm to 10 µm, preferably 50 nm to 7 µm, and more preferably 100 nm to 5 µm. The film thickness can be selected such that a desired withstand voltage can be obtained. If the thickness is too large, the resistance at the time of applying forward bias may be increased.

The laminated body of the invention can provide a Schottky barrier diode that exhibits good diode properties even if the metal oxide semiconductor layer is produced by a method that has excellent productivity such as sputtering.
(Schottky Electrode Layer)

As for the contained metal in the Schottky electrode layer, an element having a work function of 3.5 eV or more can be used, and its metal oxide can be used in the Schottky electrode layer. The work function of the metal contained in the Schottky electrode layer is preferably 4.0 eV or more, more preferably 4.4 eV or more, and further preferably 4.6 eV or more. The upper limit of the work function is not particularly restricted, but is normally 6.5 eV.

The work function is measured by photoelectron spectroscopy.

As the metal for the Schottky electrode layer, an oxide of one or more metals selected from Pd, Mo, Pt, Ir, Ru, V, Zr, Mg, Ni, W, Cr, Re, Te, Tc, Mn, Os, Fe, Rh and Co or an oxide of an alloy of these metals can be given. A Pd oxide, a Pt oxide, an Ir oxide or a Ru oxide is preferable. These metals enable a high Schottky barrier to be formed by combination of a metal oxide semiconductor.

The carrier concentration of the Schottky electrode layer is preferably $1 \times 10^{18}$ cm$^{-3}$ or more. The carrier concentration can be obtained by a hall measurement.

The thickness of the Schottky electrode layer is normally 1 nm to 1 μm, preferably 2 nm to 100 nm, more preferably 5 nm to 100 nm, and further preferably 5 nm to 50 nm. Within this range, it has an excellent on-resistance at forward bias. Further, the smoothness of the Schottky interface can be improved, whereby it has an excellent withstand voltage.

A production method for obtaining a metal oxide of the Schottky electrode is not particularly restricted. A method in which a reactive sputtering is conducted for a metal target in an oxygen-containing atmosphere or the like is given.
(Reduction Suppressing Layer)

The reduction suppressing layer is a layer that prevents the Schottky electrode layer from reducing by interaction of the buffer electrode layer and the Schottky electrode layer, and prevents formation of the initial Schottky interface.

As the metal used in the reduction suppressing layer, one or more element selected from Pd, Mo, Pt, Ir, Ru, Au, Ni, W, Cr, Re, Te, Tc, Mn, Os, Fe, Rh and Co or an alloy thereof can be given.

As the reduction suppressing layer, it is possible to use the same element as metal elements constituting a Schottky electrode layer, i.e. to use the same metal as the metal oxide constituting the Schottky electrode layer. In this case, as the combination of the reduction suppressing layer and the Schottky electrode layer (reduction suppressing layer/Schottky electrode layer), Pd/palladium oxide, Pt/platinum oxide, Ir/iridium oxide, Ru/ruthenium oxide or the like can be given.

The thickness of the reduction suppressing layer is normally 1 nm to 1 μm, preferably 2 nm to 500 nm, more preferably 5 nm to 100 nm, and particularly preferably 10 nm to 80 nm. Within this range, since it has excellent reduction suppressing effects, on-resistance at forward bias can be reduced. Further, the smoothness of the Schottky interface can be improved.
(Buffer Electrode Layer)

The buffer electrode layer is a layer that reduces damage of heat or ultrasonic waves in a wire bonding process of Al or Cu which is the next step of forming a Schottky barrier diode. The buffer electrode layer is usually preferably an electrode having a large linear expansion coefficient.

As the metal used in the buffer electrode layer, one or more elements selected from the group consisting of Pb, In, Mg, Al, Sn, Mn, Ag, Cu, Ni, Cr and Au or an alloy thereof can be given. The same element as that used in a wire is preferable. For example, when the wire is Al or Cu, if the buffer electrode layer is Al or Cu, it is preferable since it can be bonded to the wire easily.

The thickness of the buffer electrode layer is normally 200 nm to 50 μm, preferably 500 nm to 10 μm. If the thickness of the buffer electrode layer is too thin, effects of alleviating the damage is reduced, and the Schottky electrode layer and the semiconductor layer may be damaged. If the thickness is too large, on-resistance at the time of applying forward bias is increased by resistance thereof.

The method for forming each layer is not particularly restricted. However, a CVD method such as a thermal CVD method, a CAT-CVD method, a photo-CVD method, a mist CVD method, an MO-CVD method and a plasma CVD method; a film-forming method with atomic level control such as MBE and ALD; a PVD method such as ion plating, ion beam sputtering and magnetron sputtering; a doctor blading method, an injection method, an extrusion method, a hot pressing method, a sol-gel method and an aerosol deposition method, or the like; a method in which a conventionally known ceramic process is used; and a wet method such as a coating method, a spin coating method, a printing method, a spray method, an electrodeposition method, a plating method and a micellar electrolysis method can be used.
[Semiconductor Device]

The laminated body of the invention can be used in a semiconductor device such as a power semiconductor device, a (rectifying) diode device, a Schottky barrier diode device, a junction transistor device, an electrostatic discharge (ESD) protection diode, a transient voltage suppressor (TVS) diode, a light-emitting diode, a metal semiconductor field effect transistor (MESFET), a junction field effect transistor (JFET), a metal oxide semiconductor field effect transistor (MOSFET), a Schottky source/drain MOSFET, an avalanche multiplication type photoelectric conversion device, a solid state imaging device, a solar cell device, an optical sensor device, a display device, a resistance change memory or the like can be used. In particular, since current can be extracted without causing power loss, the laminated body is suited to power semiconductors. The semiconductor device can be used in a Schottky barrier diode and a junction transistor. An electric circuit using the device, the Schottky barrier diode and the junction transistor mentioned above can be used in an electric apparatus, an electronic apparatus, a vehicle, a power engine or the like.

EXAMPLES

Example 1

(Fabrication of Schottky Barrier Diode)

A p-doped n-type single crystal Si substrate (thickness: 250 μm, diameter: 4 inches) having an electric resistivity of 3 mΩcm was mounted in a sputtering apparatus (E-200S manufactured by Canon ANELVA Corporation). Next, Ti as a back electrode was formed into a film having a thickness of 150 nm. Subsequently, the substrate was turned over and was mounted in the sputtering apparatus. Then, Mo was formed into a 150 nm-thick film as the ohmic electrode layer under the conditions of DC 100 W and Ar atmosphere. Subsequently, this substrate was set in a sputtering apparatus (CS-200 manufactured by ULVAC) together with an areamask with a diameter of 0.3 mm, and a metal oxide semiconductor having a metal composition (atomic ratio) shown in Table 1 was formed into a 200 nm-thick film as the metal oxide semiconductor layer. At this time, the gas shown in Table 1 was introduced into the sputtering apparatus at the volume ratio shown in Table 1. Then, the substrate was taken out and subjected to annealing in an electric furnace for 1 hour at 300° C. in air. This substrate was again mounted in a sputtering apparatus (E-200S manufactured by Canon ANELVA Corporation) together with an areamask with a diameter of 0.2 mm, and then, the Schottky electrode layer, the reduction suppressing layer and the buffer layer were formed into a film as follows: As the Schottky electrode layer, palladium oxide was formed into a 20 nm-thick film. Film forming conditions were as follows: DC50 W and a mixed gas of Ar and $O_2$, 180 seconds. The work function of the used metal element is shown in Table 1. As the reduction suppressing layer, Pd was formed into a 50 nm-thick film. The film forming conditions were as follows: DC50 W, Ar atmosphere. As the buffer electrode layer, Al was formed into a 1 μm-thick film. The film forming conditions were DC50 W, Ar atmosphere.

The obtained Schottky barrier diode has a structure in which Ti was laminated on the back surface of the laminated body shown in FIG. 13.

(Measurement of Free Carrier Concentration of Metal Oxide Semiconductor Layer)

The free carrier concentration of the metal oxide semiconductor layer was measured as follows:

On the glass substrate, steps up to the metal oxide layer forming step in the Schottky barrier diode fabrication step mentioned above was conducted. Then, the substrate was cut into 1 cm-square pieces, and In electrodes were put on each of the four sides, whereby a device for measuring a hall effect was prepared. For this device, a hall effect measurement was conducted at room temperature by using a hall effect measurement apparatus (HL-5500PC, manufactured by ACCENT), and the obtained amount of free carriers was standardized by the volume of the metal semiconductor layer, whereby the free carrier concentration was obtained.

The free carrier concentration of the metal oxide semiconductor layer was $5 \times 10^{16}$ cm$^{-3}$.

(Carrier Concentration of Schottky Electrode Layer)

The carrier concentration of the Schottky electrode layer was measured as follows:

On the glass substrate, steps up to the metal oxide semiconductor layer forming step in the above-described Schottky barrier diode fabricating step were conducted. Then, the substrate was cut into 1 cm-square pieces, and In electrodes were put on each of the four sides, whereby a device for measuring a hall effect was prepared. For this device, a hall effect measurement was conducted at room temperature by using a hall effect measurement apparatus (HL-5500PC, manufactured by ACCENT), and the obtained amount of free carriers was standardized by the volume of the metal semiconductor layer, whereby the carrier concentration was obtained.

The carrier concentration of the Schottky barrier diode was $1 \times 10^{20}$ cm$^{-3}$.

For the obtained Schottky barrier diode, the following evaluation was conducted. The results are shown in Table 1.

(Evaluation of On-Resistance and Leakage Current)

For the obtained device, on-resistance (Ron) and leakage current (Ir) were evaluated using B1500 manufactured by Agilent. The substrate side was grounded, and the other probe was connected to the buffer electrode side, and a measurement was conducted by changing the voltage. The on-resistance was a differential resistance (Ron=ΔV/ΔI) within ±0.2 V when 1V was applied to the device, and the leakage current was the current density when the applied voltage was −5V.

(Evaluation of Band Gap of Metal Oxide Semiconductor Layer)

The band gap of the metal oxide semiconductor layer was evaluated as follows:

On the substrate, steps up to the metal oxide semiconductor layer forming step in the above-described Schottky barrier diode fabricating step were conducted, and the obtained laminated body was cut into 1 cm-square pieces. At room temperature, the incident angle of polarized light was changed to 50°, 60° and 70° from the direction vertical to the substrate using a spectroscopic ellipsometry measurement apparatus (M-2000D manufactured by JA Woollam Japan KK), and for each incident angle, measurement was carried out with measurement wavelengths of 192.3 nm to 1689 nm and measuring widths of 3.4 nm. For the resulting spectra ψ and Δ, for each layer, Drude model, Tauc-Lorentz model, Gaussian function model were used as the absorption model, optimization was conducted until the square error MSE became 10 or less, whereby an absorption coefficient α was calculated for the energy of each light. By using the spectrum of the absorption coefficient α of the metal oxide semiconductor layer, $\alpha^2$ was plotted against the light energy range (2 eV to 5 eV), and the straight line was extended and the intersection with the energy axis was calculated as a band gap.

(Evaluation of Hydrogen Atom Concentration of Metal Oxide Semiconductor Layer)

The concentration of hydrogen atom of the metal oxide semiconductor layer of the Schottky barrier diode obtained was evaluated as follows:

Measurement was conducted by using a quadrupole secondary mass spectrometer (D-SIMS manufactured by Ulvac-Phi. Inc.) under measurement conditions of Cs ion source 1 kV, a primary ion current 100 nA and the vacuum degree of chamber $5 \times 10^{-10}$ torr. The hydrogen atom concentration of the metal oxide semiconductor layer was determined as follows: The intensity, which is obtained by integrating the secondary ion intensity at each depth H obtained by the quadrupole secondary ion mass spectrometer with the film thickness of the metal semiconductor thin film, was normalized using the intensity of In—Ga—Zn—O thin film of which the hydrogen concentration and the film thickness are known, and the quantification of the hydrogen concentration was performed, and the obtained value was taken as the hydrogen atom concentration.

Examples 2 to 4

Schottky barrier diodes were fabricated and evaluated in the same manner as in Example 1, except that the compositions of the Schottky barrier diode and the reduction suppressing layer were changed to those shown in Table 1. The results are shown in Table 1.

The free carrier concentration of the metal oxide semiconductor layer was $5 \times 10^{16}$ cm$^{-3}$. The carrier concentration of the Schottky electrode layer was $1 \times 10^{20}$ cm$^{-3}$.

The Schottky barrier diode obtained in Examples 1 to 4 had an on-resistance Ron of less than 1 mΩcm$^2$ and had leakage current Ir of $4 \times 10^{-8}$ A/cm$^2$ or less, showing excellent diode characteristics.

Comparative Example 1

A Schottky barrier diode was fabricated and evaluated in the same manner as in Example 1, except that no reduction suppressing layer was provided. The results are shown in Table 1.

The device obtained in Comparative Example 1 has a significantly high on-resistance Ron of 50 mΩcm$^2$ and had leakage current Ir of $2 \times 10^0$ A/cm$^2$, which were higher than those obtained in Examples 1 to 4.

TABLE 1

|  |  |  | Example 1 | Example 2 | Example 3 | Example 4 | Comp. Ex. 1 |
|---|---|---|---|---|---|---|---|
| Device configuration | Substrate back electrode | Material | Ti | Ti | Ti | Ti | Ti |
|  |  | Film thickness (nm) | 150 | 150 | 150 | 150 | 150 |
|  | Substrate | Material | P doped n-type monocrystal Si | P doped n-type monocrystal Si | P doped n-type monocrystal Si | P doped n-type monocrystal Si | P doped n-type monocrystal Si |
|  |  | Electric resistivity (mΩ cm) | 3 | 3 | 3 | 3 | 3 |
|  |  | Thickness (μm) | 250 | 250 | 250 | 250 | 250 |
|  | Ohmic electrode | Composition | Mo | Mo | Mo | Mo | Mo |
|  |  | Film thickness (nm) | 150 | 150 | 150 | 150 | 150 |
|  | Metal oxide semiconductor layer | Metal composition ratio | In:Ga:Zn = 33.3:33.3:33.3 at % | In:Ga:Zn = 33.3:33.3:33.3 at % | In:Ga:Zn = 33.3:33.3:33.3 at % | In:Ga:Zn = 33.3:33.3:33.3 at % | In:Ga:Zn = 33.3:33.3:33.3 at % |
|  |  | Introduced gas at the time of film formation (volume ratio) | Ar, $H_2O$ (Ar:$H_2O$ = 99:1) | Ar, $H_2O$ (Ar:$H_2O$ = 99:1) | Ar, $H_2O$ (Ar:$H_2O$ = 99:1) | Ar, $H_2O$ (Ar:$H_2O$ = 99:1) | Ar, $H_2O$ (Ar:$H_2O$ = 99:1) |
|  |  | Film thickness (nm) | 200 | 200 | 200 | 200 | 200 |
|  |  | Hydrogen atom concentration ($cm^{-3}$) | $4 \times 10^{20}$ | $4 \times 10^{20}$ | $4 \times 10^{20}$ | $4 \times 10^{20}$ | $4 \times 10^{20}$ |
|  |  | Band gap (eV) | 3.75 | 3.75 | 3.75 | 3.75 | 3.75 |
|  | Schottky electrode layer | Composition | Palladium oxide | Ruthenium oxide | Platinum oxide | Iridium oxide | Palladium oxide |
|  |  | Work function of contained metal (eV) | 5.1 | 4.7 | 5.6 | 5.3 | 5.1 |
|  |  | Film thickness (nm) | 20 | 20 | 20 | 20 | 20 |
|  |  | Size (diameter: mm) | 0.2 | 0.2 | 0.2 | 0.2 | 0.2 |
|  | Reduction suppressing layer | Composition | Pd | Ru | Pt | Ir | None |
|  |  | Film thickness (nm) | 50 | 50 | 50 | 50 |  |
|  |  | Size (diameter: mm) | 0.2 | 0.2 | 0.2 | 0.2 |  |
|  | Buffer electrode layer | Composition | Al | Al | Al | Al | Al |
|  |  | Film thickness (μm) | 1 | 1 | 1 | 1 | 1 |
|  |  | Size (diameter: mm) | 0.2 | 0.2 | 0.2 | 0.2 | 0.2 |
| Diode properties | Forward properties: on-resistance (mΩ $cm^2$) |  | <1 | <1 | <1 | <1 | 50 |
|  | Reverse properties: leakage current (A/$cm^2$) |  | $2 \times 10^{-9}$ | $2 \times 10^{-8}$ | $4 \times 10^{-8}$ | $3 \times 10^{-9}$ | $2 \times 10^{0}$ |

Examples 5 to 8

Schottky barrier diodes were fabricated and evaluated in the same manner as in Example 1, except that the compositions of the Schottky electrode layer and the reduction suppressing layer were changed to those shown in Table 2. The results are shown in Table 2.

The free carrier concentration of the metal oxide semiconductor layer was $5 \times 10^{16}$ $cm^{-3}$. The carrier concentration of the Schottky electrode layer was $1 \times 10^{20}$ $cm^{-3}$.

The Schottky barrier diodes obtained in Examples 5 to 8 had an on-resistance Ron of less than 10 mΩ$cm^2$ and had leakage current Ir of $2 \times 10^{-8}$ A/$cm^2$ or less, showing excellent diode characteristics.

TABLE 2

|  |  |  | Example 5 | Example 6 | Example 7 | Example 8 |
|---|---|---|---|---|---|---|
| Device configuration | Substrate back electrode | Material | Ti | Ti | Ti | Ti |
|  |  | Film thickness (nm) | 150 | 150 | 150 | 150 |
|  | Substrate | Material | P doped n-type monocrystal Si | P doped n-type monocrystal Si | P doped n-type monocrystal Si | P doped n-type monocrystal Si |
|  |  | Electric resistivity (mΩ cm) | 3 | 3 | 3 | 3 |
|  |  | Thickness (μm) | 250 | 250 | 250 | 250 |
|  | Ohmic electrode layer | Composition | Mo | Mo | Mo | Mo |
|  |  | Film thickness (nm) | 150 | 150 | 150 | 150 |
|  | Metal oxide semiconductor layer | Metal composition ratio | In:Ga:Zn = 33.3:33.3:33.3 at % | In:Ga:Zn = 33.3:33.3:33.3 at % | In:Ga:Zn = 33.3:33.3:33.3 at % | In:Ga:Zn = 33.3:33.3:33.3 at % |
|  |  | Introduced gas at the time of film formation (volume ratio) | Ar, $H_2O$ (Ar:$H_2O$ = 99:1) | Ar, $H_2O$ (Ar:$H_2O$ = 99:1) | Ar, $H_2O$ (Ar:$H_2O$ = 99:1) | Ar, $H_2O$ (Ar:$H_2O$ = 99:1) |
|  |  | Film thickness (nm) | 200 | 200 | 200 | 200 |
|  |  | Hydrogen atom concentration ($cm^{-3}$) | $4 \times 10^{20}$ | $4 \times 10^{20}$ | $4 \times 10^{20}$ | $4 \times 10^{20}$ |
|  |  | Band gap (eV) | 3.75 | 3.75 | 3.75 | 3.75 |
|  | Schottky electrode layer | Composition | Palladium oxide | Ruthenium oxide | Platinum oxide | Iridium oxide |
|  |  | Work function of contained metal element (eV) | 5.1 | 4.7 | 5.6 | 5.3 |
|  |  | Film thickness (nm) | 20 | 20 | 20 | 20 |
|  |  | Size (diameter: mm) | 0.2 | 0.2 | 0.2 | 0.2 |
|  | Reduction suppressing layer | Composition | Ru | Pt | Ir | Pd |
|  |  | Film thickness (nm) | 50 | 50 | 50 | 50 |
|  |  | Size (diameter: mm) | 0.2 | 0.2 | 0.2 | 0.2 |
|  | Buffer electrode layer | Composition | Al | Al | Al | Al |
|  |  | Film thickness (μm) | 1 | 1 | 1 | 1 |
|  |  | Size (diameter: mm) | 0.2 | 0.2 | 0.2 | 0.2 |

TABLE 2-continued

|  |  | Example 5 | Example 6 | Example 7 | Example 8 |
|---|---|---|---|---|---|
| Diode properties | Forward properties: on-resistance (mΩ cm$^2$) | 3 | 8 | 4 | 6 |
|  | Reverse properties: leakage current (A/cm$^2$) | $2 \times 10^{-8}$ | $6 \times 10^{-9}$ | $1 \times 10^{-8}$ | $6 \times 10^{-9}$ |

Examples 9 to 11

Schottky barrier diodes were fabricated and evaluated in the same manner as in Example 1, except that the film thickness of the Schottky electrode layer was changed to those shown in Table 3. The results are shown in Table 3.

The free carrier concentration of the metal oxide semiconductor layer was $5 \times 10^{16}$ cm$^{-3}$. The carrier concentration of the Schottky electrode layer was $1 \times 10^{20}$ cm$^{-3}$.

The Schottky barrier diodes obtained in Examples 9 and 10 had an on-resistance Ron of less than 1 mΩcm$^2$ and had leakage current Ir of $3 \times 10^{-7}$ A/cm$^2$ or less, showing excellent diode characteristics. The Schottky barrier diode obtained in Example 11 had an on-resistance Ron of less than 10 mΩcm$^2$ and had leakage current Ir of $3 \times 10^{-7}$ A/cm$^2$, showing excellent diode characteristics.

Examples 12 to 14

Schottky barrier diodes were fabricated and evaluated in the same manner as in Example 1, except that the film-forming conditions of the ohmic electrode layer were changed to DC50 W and the compositions of the Schottky electrode layer and the reduction suppressing layer were changed to those shown in Table 4. The results are shown in Table 4.

The free carrier concentration of the metal oxide semiconductor layer was $5 \times 10^{16}$ cm$^{-3}$ and the carrier concentration of the Schottky electrode layer was $1 \times 10^{20}$ cm$^{-3}$.

The Schottky barrier diode obtained in Example 12 had an on-resistance Ron of less than 1 mΩcm$^2$ and leakage current Ir of $9 \times 10^{-6}$, showing excellent diode characteristics. The

TABLE 3

|  |  |  | Example 9 | Example 10 | Example 11 |
|---|---|---|---|---|---|
| Device configuration | Substrate back electrode | Material | Ti | Ti | Ti |
|  |  | Film thickness (nm) | 150 | 150 | 150 |
|  | Substrate | Material | P doped n-type monocrystal Si | P doped n-type monocrystal Si | P doped n-type monocrystal Si |
|  |  | Electric resistivity (mΩcm) | 3 | 3 | 3 |
|  |  | Thickness (μm) | 250 | 250 | 250 |
|  | Ohmic electrode layer | Composition | Mo | Mo | Mo |
|  |  | Film thickness (nm) | 150 | 150 | 150 |
|  | Metal oxide semiconductor layer | Metal composition ratio | In:Ga:Zn = 33.3:33.3:33.3 at % | In:Ga:Zn = 33.3:33.3:33.3 at % | In:Ga:Zn = 33.3:33.3:33.3 at % |
|  |  | Introduced gas at the time of film formation (volume ratio) | Ar, H$_2$O (Ar:H$_2$O = 99:1) | Ar, H$_2$O (Ar:H$_2$O = 99:1) | Ar, H$_2$O (Ar:H$_2$O = 99:1) |
|  |  | Film thickness (nm) | 200 | 200 | 200 |
|  |  | Hydrogen atom concentration (cm$^{-3}$) | $4 \times 10^{20}$ | $4 \times 10^{20}$ | $4 \times 10^{20}$ |
|  |  | Band gap (eV) | 3.75 | 3.75 | 3.75 |
|  | Schottky electrode layer | Composition | Palladium oxide | Palladium oxide | Palladium oxide |
|  |  | Work function (eV) | 5.1 | 5.1 | 5.1 |
|  |  | Film thickness (nm) | 5 | 50 | 100 |
|  |  | Size (diameter: mm) | 0.2 | 0.2 | 0.2 |
|  | Reduction suppressing layer | Composition | Pd | Pd | Pd |
|  |  | Film thickness (nm) | 50 | 50 | 50 |
|  |  | Size (diameter: mm) | 0.2 | 0.2 | 0.2 |
|  | Buffer electrode layer | Composition | Al | Al | Al |
|  |  | Film thickness (μm) | 1 | 1 | 1 |
|  |  | Size (diameter: mm) | 0.2 | 0.2 | 0.2 |
| Diode characteristics |  | Forward properties: on-resistance (mΩcm$^2$) | <1 | <1 | 4 |
|  |  | Reverse properties: leakage current (A/cm$^2$) | $3 \times 10^{-7}$ | $8 \times 10^{-8}$ | $3 \times 10^{-7}$ |

Schottky barrier diodes obtained in Examples 13 and 14 had an on-resistance Ron of less than 1 mΩcm$^2$ and had leakage current Ir of $1 \times 10^{-2}$ A/cm$^2$ and $1 \times 10^{-1}$ A/cm$^2$, showing excellent diode characteristics.

TABLE 4

|  |  |  | Example 12 | Example 13 | Example 14 |
|---|---|---|---|---|---|
| Device configuration | Substrate back electrode | Material | Ti | Ti | Ti |
|  |  | Film thickness (nm) | 150 | 150 | 150 |
|  | Substrate | Material | P doped n-type monocrystal Si | P doped n-type monocrystal Si | P doped n-type monocrystal Si |
|  |  | Electric resistivity (mΩcm) | 3 | 3 | 3 |
|  |  | Thickness (μm) | 250 | 250 | 250 |
|  | Ohmic electrode layer | Composition | Mo | Mo | Mo |
|  |  | Film thickness (nm) | 150 | 150 | 150 |

TABLE 4-continued

|  |  | Example 12 | Example 13 | Example 14 |
|---|---|---|---|---|
| Metal oxide semiconductor layer | Metal composition ratio | In:Ga:Zn = 33.3:33.3:33.3 at % | In:Ga:Zn = 33.3:33.3:33.3 at % | In:Ga:Zn = 33.3:33.3:33.3 at % |
|  | Introduced gas at the time of film formation (volume ratio) | Ar, $H_2O$ (Ar:$H_2O$ = 99:1) | Ar, $H_2O$ (Ar:$H_2O$ = 99:1) | Ar, $H_2O$ (Ar:$H_2O$ = 99:1) |
|  | Film thickness (nm) | 200 | 200 | 200 |
|  | Hydrogen atom concentration ($cm^{-3}$) | $4 \times 10^{20}$ | $4 \times 10^{20}$ | $4 \times 10^{20}$ |
|  | Band gap (eV) | 3.75 | 3.75 | 3.75 |
| Schottky electrode layer | Composition | Vanadium oxide | Zirconium oxide | Magnesium oxide |
|  | Work function of contained metal element (eV) | 4.4 | 4.1 | 3.7 |
|  | Film thickness (nm) | 20 | 20 | 20 |
|  | Size (diameter: mm) | 0.2 | 0.2 | 0.2 |
| Reduction suppressing layer | Composition | V | Zr | Mg |
|  | Film thickness (nm) | 50 | 50 | 50 |
|  | Size (diameter: mm) | 0.2 | 0.2 | 0.2 |
| Buffer electrode layer | Composition | Al | Al | Al |
|  | Film thickness (μm) | 1 | 1 | 1 |
|  | Size (diameter: mm) | 0.2 | 0.2 | 0.2 |
| Diode characteristics | Forward properties: on-resistance (mΩ$cm^2$) | <1 | <1 | <1 |
|  | Reverse properties: leakage current (A/$cm^2$) | $9 \times 10^{-6}$ | $1 \times 10^{-2}$ | $1 \times 10^{-1}$ |

Examples 15 to 18

Schottky barrier diodes were fabricated in the same manner as in Example 1, except that the substrate was changed to the semiconductor substrate shown in Table 5.

The evaluation of the on-resistance and the leakage current was conducted as follows: a probe was connected to a portion in which the ohmic electrode side was exposed and grounded, and the other probe was connected to the buffer electrode layer, and measurement was conducted while changing the voltage.

The free carrier concentration of the metal oxide semiconductor layer was $5 \times 10^{16}$ $cm^{-3}$ and the carrier concentration of the Schottky electrode layer was $1 \times 10^{20}$ $cm^{-3}$. Other evaluations were conducted in the same manner as in Example 1. The results are shown in Table 5.

(Measurement of Surface Roughness of Substrate)

The surface roughness of the substrate was measured by observing the fabricated Schottky barrier diode by a cross-sectional TEM (transmission electron microscope) image and EDX (energy-dispersive X-ray spectroscopy). The specific procedures are shown below. The area where each constituent element of each substrate shown in Table 5 was detected by EDX is defined as the substrate. Furthermore, in the cross-sectional TEM image, an interface was defined from the difference in contrast between the substrate and the ohmic electrode layer. An arithmetic mean roughness Ra was calculated by the formula (1) for the unevenness of the substrate interface with respect to a cross-sectional TEM image of an area of 10 μm in the direction perpendicular to the film thickness, and was defined as surface roughness. The results are shown in Table 5.

$$Ra = \frac{1}{l}\int_0^l |f(x)|dx \quad (1)$$

l: Film thickness and length of observation area in vertical direction (here, 10 μm)

f(x): Function showing unevenness of interface (Evaluation of Crystallinity of Substrate)

The crystallinity of the substrate was evaluated by an electron beam diffraction image obtained by an electron microscope (JEM-2800 manufactured by JEOL). The irradiation area of the electron beam is a region having a diameter of 10 nm or more with respect to the substrate cross section and a diffraction image was obtained from the region. In the diffraction image, one in which the spot shape was observed was determined as monocrystalline and the one observed in the ring shape was judged as polycrystalline. The results are shown in Table 5.

The Schottky barrier diodes obtained in Examples 15 to 17 had an on-resistance Ron of less than 1 mΩ$cm^2$, and had leakage current of $2 \times 10^{-9}$ A/$cm^2$ or less, showing excellent diode characteristics. The Schottky barrier diodes obtained in Example 18 had an on-resistance Ron of less than 1 mΩ$cm^2$, and had leakage current Ir of $2 \times 10^{-1}$ A/$cm^2$, showing excellent diode characteristics.

TABLE 5

|  |  | Example 15 | Example 16 | Example 17 | Example 18 |
|---|---|---|---|---|---|
| Substrate | Material | ZnO | ZnO | SiC | ZnO |
|  | Surface roughness Ra [nm] | 10 | 2 | 3 | 100 |
|  | Crystallinity | Polycrystalline | Monocrystalline | Monocrystalline | Monocrystalline |
|  | Thickness (μm) | 250 | 250 | 250 | 250 |
| Ohmic electrode layer | Composition | Mo | Mo | Mo | Mo |
|  | Film thickness (nm) | 150 | 150 | 150 | 150 |
| Metal oxide semiconductor layer | Metal composition ratio | In:Ga:Zn = 33.3:33.3:33.3 at % | In:Ga:Zn = 33.3:33.3:33.3 at % | In:Ga:Zn = 33.3:33.3:33.3 at % | In:Ga:Zn = 33.3:33.3:33.3 at % |
|  | Introduced gas at the time of film formation (volume ratio) | Ar, $H_2O$ (Ar:$H_2O$ = 99:1) | Ar, $H_2O$ (Ar:$H_2O$ = 99:1) | Ar, $H_2O$ (Ar:$H_2O$ = 99:1) | Ar, $H_2O$ (Ar:$H_2O$ = 99:1) |
|  | Film thickness (nm) | 200 | 200 | 200 | 200 |

TABLE 5-continued

|  |  |  | Example 15 | Example 16 | Example 17 | Example 18 |
|---|---|---|---|---|---|---|
|  |  | Hydrogen atom concentration ($cm^{-3}$) | $4 \times 10^{20}$ | $4 \times 10^{20}$ | $4 \times 10^{20}$ | $4 \times 10^{20}$ |
|  |  | Band gap (eV) | 3.75 | 3.75 | 3.75 | 3.75 |
|  | Schottky electrode layer | Composition | Palladium oxide | Palladium oxide | Palladium oxide | Palladium oxide |
|  |  | Work function of contained metal element (eV) | 5.1 | 5.1 | 5.1 | 5.1 |
|  |  | Film thickness (nm) | 20 | 20 | 20 | 20 |
|  |  | Size (diameter: mm) | 0.2 | 0.2 | 0.2 | 0.2 |
|  | Reduction suppressing layer | Composition | Pd | Pd | Pd | Pd |
|  |  | Film thickness (nm) | 50 | 50 | 50 | 50 |
|  |  | Size (diameter: mm) | 0.2 | 0.2 | 0.2 | 0.2 |
|  | Buffer electrode layer | Composition | Al | Al | Al | Al |
|  |  | Film thickness (μm) | 1 | 1 | 1 | 1 |
|  |  | Size (diameter: mm) | 0.2 | 0.2 | 0.2 | 0.2 |
| Diode properties | Forward properties: on-resistance (mΩ $cm^2$) |  | <1 | <1 | <1 | <1 |
|  | Reverse properties: leakage current (A/$cm^2$) |  | $1 \times 10^{-9}$ | $2 \times 10^{-10}$ | $2 \times 10^{-9}$ | $2 \times 10^{-1}$ |

Examples 19 to 22

Schottky barrier diodes were fabricated and evaluated in the same manner as in Example 15, except that the substrate was changed to the insulating substrates shown in Table 6. The results are shown in Table 6.

The free carrier concentration of the metal oxide semiconductor layer was $5 \times 10^{16}$ $cm^{-3}$, and the carrier concentration of the Schottky electrode layer was $1 \times 10^{20}$ $cm^{-3}$.

The Schottky barrier diodes obtained in Examples 19 to 22 had an on-resistance Ron of less than 1 mΩ$cm^2$ and had leakage current Ir of $1 \times 10^{-7}$ A/$cm^2$ or less, showing excellent diode characteristics.

Examples 23 to 26

Schottky barrier diodes were fabricated and evaluated in the same manner as in Example 1, except that, as for the formation of the metal oxide semiconductor layer, the metal composition (atomic ratio) of the metal oxide semiconductor was changed to that shown in Table 7 and the introduced gas at the time of film formation was changed to that shown in Table 7. The results are shown in Table 7.

The free carrier concentration of the metal oxide semiconductor layer was as shown in Table 7, and the carrier concentration of the Schottky electrode layer was $1 \times 10^{20}$ $cm^{-3}$.

TABLE 6

|  |  |  | Example 19 | Example 20 | Example 21 | Example 22 |
|---|---|---|---|---|---|---|
|  | Substrate | Material | Quartz glass | Sapphire glass | Polyimide | Lithium niobate |
|  |  | Surface roughness Ra [nm] | 1 | 4 | 3 | 15 |
|  |  | Cristallinity | Amorphous | Monocrystalline | Amorphous | Amorphous |
|  |  | Thickness (μm) | 250 | 250 | 250 | 250 |
|  | Ohmic electrode layer | Composition | Mo | Mo | Mo | Mo |
|  |  | Film thickness (nm) | 150 | 150 | 150 | 150 |
|  | Metal oxide semiconductor layer | Metal composition ratio | In:Ga:Zn = 33.3:33.3:33.3 at % | In:Ga:Zn = 33.3:33.3:33.3 at % | In:Ga:Zn = 33.3:33.3:33.3 at % | In:Ga:Zn = 33.3:33.3:33.3 at % |
|  |  | Introduced gas at the time of film formation (volume ratio) | Ar, $H_2O$ (Ar:$H_2O$ = 99:1) | Ar, $H_2O$ (Ar:$H_2O$ = 99:1) | Ar, $H_2O$ (Ar:$H_2O$ = 99:1) | Ar, $H_2O$ (Ar:$H_2O$ = 99:1) |
|  |  | Film thickness (nm) | 200 | 200 | 200 | 200 |
|  |  | Hydrogen atom concentration ($cm^{-3}$) | $4 \times 10^{20}$ | $4 \times 10^{20}$ | $4 \times 10^{20}$ | $4 \times 10^{20}$ |
|  |  | Band gap (eV) | 3.75 | 3.75 | 3.75 | 3.75 |
|  | Schottky electrode layer | Composition | Palladium oxide | Palladium oxide | Palladium oxide | Palladium oxide |
|  |  | Work function of contained metal element (eV) | 5.1 | 5.1 | 5.1 | 5.1 |
|  |  | Film thickness (nm) | 20 | 20 | 20 | 20 |
|  |  | Size (diameter: mm) | 0.2 | 0.2 | 0.2 | 0.2 |
|  | Reduction suppressing layer | Composition | Pd | Pd | Pd | Pd |
|  |  | Film thickness (nm) | 50 | 50 | 50 | 50 |
|  |  | Size (diameter: mm) | 0.2 | 0.2 | 0.2 | 0.2 |
|  | Buffer electrode layer | Composition | Al | Al | Al | Al |
|  |  | Film thickness (μm) | 1 | 1 | 1 | 1 |
|  |  | Size (diameter: mm) | 0.2 | 0.2 | 0.2 | 0.2 |
| Diode characteristics | Forward properties: on-resistance (mΩ $cm^2$) |  | <1 | <1 | <1 | <1 |
|  | Reverse properties: leakage current (A/$cm^2$) |  | $1 \times 10^{-7}$ | $1 \times 10^{-8}$ | $5 \times 10^{-8}$ | $5 \times 10^{-8}$ |

The Schottky barrier diodes obtained in Examples 23 to 26 had an on-resistance Ron of less than 1 mΩcm² and had leakage current Ir of 2×10⁻⁹ A/cm² or less, showing excellent diode characteristics.

The hydrogen atom concentration of the metal oxide semiconductor layer in Examples 27 and 28 were 8×10²⁰ cm⁻³ and 5×10²¹ cm⁻³. The Schottky barrier diodes obtained in Examples 27 and 28 had an on-resistance Ron of less than 1 mΩcm² and had leakage current Ir of 1×10⁻⁹ A/cm² or less, showing excellent diode characteristics.

The hydrogen atom concentration of the metal oxide semiconductor layer in Examples 29 and 30 were 4×10¹⁵ cm⁻³ and 8×10¹⁶ cm⁻³. The Schottky barrier diodes obtained in Examples 19 and 20 had an on-resistance Ron of less than 1 mΩcm² and had leakage current Ir of 8×10⁻¹ A/cm² and 5×10⁻² A/cm² or less, showing excellent diode characteristics.

TABLE 7

|  |  |  | Example 23 | Example 24 | Example 25 | Example 26 |
|---|---|---|---|---|---|---|
| Device configuration | Substrate back electrode | Material | Ti | Ti | Ti | Ti |
|  |  | Film thickness (nm) | 150 | 150 | 150 | 150 |
|  | Substrate | Material | P doped n-type monocrystal Si | P doped n-type monocrystal Si | P doped n-type monocrystal Si | P doped n-type monocrystal Si |
|  |  | Electric resistivity (mΩ cm) | 3 | 3 | 3 | 3 |
|  |  | Thickness (μm) | 250 | 250 | 250 | 250 |
|  | Ohmic electrode layer | Composition | Mo | Mo | Mo | Mo |
|  |  | Film thickness (nm) | 150 | 150 | 150 | 150 |
|  | Metal oxide semiconductor layer | Metal composition ratio | In:Sn:Zn = 36.5:15:48.5 at % | In:Sn:Zn = 36.5:15:48.5 at % | In = 100% | In:Ga = 50:50 at % |
|  |  | Introduced gas at the time of film formation (volume ratio) | Ar, H₂O (Ar:H₂O = 99.5:0.5) | Ar, H₂O (Ar:H₂O = 90:10) | Ar, H₂O (Ar:H₂O = 98:2) | Ar, H₂O (Ar:H₂O = 98:2) |
|  |  | Film thickness (nm) | 200 | 200 | 200 | 200 |
|  |  | Hydrogen atom concentration (cm⁻³) | 6 × 10¹⁹ | 2 × 10²¹ | 6 × 10²⁰ | 6 × 10²⁰ |
|  |  | Free carrier concentration (cm⁻³) | 8 × 10¹⁶ | 2 × 10¹⁵ | 8 × 10¹⁶ | 3 × 10¹⁵ |
|  |  | Band gap (eV) | 3.45 | 3.54 | 3.16 | 4.01 |
|  | Schottky electrode layer | Composition | Palladium oxide | Palladium oxide | Palladium oxide | Palladium oxide |
|  |  | Work function of contained metal element (eV) | 5.1 | 5.1 | 5.1 | 5.1 |
|  |  | Film thickness (nm) | 20 | 20 | 20 | 20 |
|  |  | Size (diameter: mm) | 0.2 | 0.2 | 0.2 | 0.2 |
|  | Reduction suppressing layer | Composition | Pd | Pd | Pd | Pd |
|  |  | Film thickness (nm) | 50 | 50 | 50 | 50 |
|  |  | Size (diameter: mm) | 0.2 | 0.2 | 0.2 | 0.2 |
|  | Buffer electrode layer | Composition | Al | Al | Al | Al |
|  |  | Film thickness (μm) | 1 | 1 | 1 | 1 |
|  |  | Size (diameter: mm) | 0.2 | 0.2 | 0.2 | 0.2 |
| Diode properties | Forward properties: on-resistance (mΩ cm²) |  | <1 | <1 | <1 | <1 |
|  | Reverse properties: leakage current (A/cm²) |  | 2 × 10⁻⁹ | 2 × 10⁻⁹ | 2 × 10⁻⁹ | 2 × 10⁻¹⁰ |

Examples 27 to 30

Schottky barrier diodes were fabricated and evaluated in the same manner as in Example 1, except that the introduced gas at the time of film formation and the ratio thereof were changed to those shown in Table 8. The results are shown in Table 8. The free carrier concentration of the metal oxide semiconductor layer was as shown in Table 8, and the carrier concentration of the Schottky electrode layer was 1×10²⁰ cm⁻³.

TABLE 8

|  |  |  | Example 27 | Example 28 | Example 29 | Example 30 |
|---|---|---|---|---|---|---|
| Device configuration | Substrate back electrode | Material | Ti | Ti | Ti | Ti |
|  |  | Film thickness (nm) | 150 | 150 | 150 | 150 |
|  | Substrate | Material | P doped n-type monocrystal Si | P doped n-type monocrystal Si | P doped n-type monocrystal Si | P doped n-type monocrystal Si |
|  |  | Electric resistivity (mΩ cm) | 3 | 3 | 3 | 3 |
|  |  | Thickness (μm) | 250 | 250 | 250 | 250 |
|  | Ohmic electrode layer | Composition | Mo | Mo | Mo | Mo |
|  |  | Film thickness (nm) | 150 | 150 | 150 | 150 |
|  | Metal oxide semiconductor layer | Metal composition ratio | In:Ga:Zn = 33.3:33.3:33.3 at % | In:Ga:Zn = 33.3:33.3:33.3 at % | In:Ga:Zn = 33.3:33.3:33.3 at % | In:Ga:Zn = 33.3:33.3:33.3 at % |
|  |  | Introduced gas at the time of film formation (volume ratio) | Ar, H₂O (Ar:H₂O = 98:2) | Ar, H₂O (Ar:H₂O = 90:10) | Ar, O₂ (Ar:O₂ = 90:10) | Ar, O₂ (Ar:O₂ = 80:20) |
|  |  | Film thickness (nm) | 200 | 200 | 200 | 200 |
|  |  | Hydrogen atom concentration (cm⁻³) | 8 × 10²⁰ | 5 × 10²¹ | 4 × 10¹⁵ | 8 × 10¹⁶ |
|  |  | Free carrier concentration (cm⁻³) | 1 × 10¹⁶ | 7 × 10¹⁵ | 8 × 10¹⁶ | 1 × 10¹⁷ |
|  |  | Band gap (eV) | 3.78 | 3.83 | 3.70 | 3.70 |
|  | Schottky electrode layer | Composition | Palladium oxide | Palladium oxide | Palladium oxide | Palladium oxide |
|  |  | Work function of contained metal element (eV) | 5.1 | 5.1 | 5.1 | 5.1 |
|  |  | Film thickness (nm) | 20 | 20 | 20 | 20 |
|  |  | Size (diameter: mm) | 0.2 | 0.2 | 0.2 | 0.2 |

TABLE 8-continued

|  |  | Example 27 | Example 28 | Example 29 | Example 30 |
|---|---|---|---|---|---|
| Reduction suppressing layer | Composition | Pd | Pd | Pd | Pd |
|  | Film thickness (nm) | 50 | 50 | 50 | 50 |
|  | Size (diameter: mm) | 0.2 | 0.2 | 0.2 | 0.2 |
| Buffer electrode layer | Composition | Al | Al | Al | Al |
|  | Film thickness (μm) | 1 | 1 | 1 | 1 |
|  | Size (diameter: mm) | 0.2 | 0.2 | 0.2 | 0.2 |
| Diode characteristics | Forward properties: on-resistance (mΩ cm$^2$) | <1 | <1 | <1 | <1 |
|  | Reverse properties: leakage current (A/cm$^2$) | $1 \times 10^{-9}$ | $5 \times 10^{-10}$ | $8 \times 10^{-1}$ | $5 \times 10^{-2}$ |

Example 31

A Schottky barrier diode was fabricated and evaluated in the same manner as in Example 1, except that the composition of the ohmic electrode layer was changed to those shown in Table 9. The results are shown in Table 9.

The free carrier concentration of the metal oxide semiconductor layer was $5 \times 10^{16}$ cm$^{-3}$, and the carrier concentration of the Schottky electrode layer was $1 \times 10^{20}$ cm$^{-3}$.

The Schottky barrier diode obtained in Example 31 had an on-resistance Ron of less than 1 mΩcm$^2$ and had leakage current Ir of $2 \times 10^{-9}$ A/cm$^2$ or less, showing excellent diode characteristics.

TABLE 9

|  |  |  | Example 31 |
|---|---|---|---|
| Device configuration | Substrate back electrode | Material | Ti |
|  |  | Film thickness (nm) | 150 |
|  | Substrate | Material | P doped n-type monocrystal Si |
|  |  | Electric resistivity (mΩcm) | 3 |
|  |  | Thickness (μm) | 250 |
|  | Ohmic electrode layer | Composition | Ti |
|  |  | Film thickness (nm) | 150 |
|  | Metal oxide semiconductor layer | Metal composition ratio | In:Ga:Zn = 33.3:33.3:33.3 at % |
|  |  | Introduced gas at the time of film formation (volume ratio) | Ar, H$_2$O (Ar:H$_2$O = 99:1) |
|  |  | Film thickness (nm) | 200 |
|  |  | Hydrogen atom concentration (cm$^{-3}$) | $4 \times 10^{20}$ |
|  |  | Band gap (eV) | 3.75 |
|  | Schottky electrode layer | Composition | Palladium oxide |
|  |  | Work function of contained metal element (eV) | 5.1 |
|  |  | Film thickness (nm) | 20 |
|  |  | Size (diameter: mm) | 0.2 |
|  | Reduction suppressing layer | Composition | Pd |
|  |  | Film thickness (nm) | 50 |
|  |  | Size (diameter: mm) | 0.2 |
|  | Buffer electrode layer | Composition | Al |
|  |  | Film thickness (μm) | 1 |
|  |  | Size (diameter: mm) | 0.2 |
| Diode properties | Forward properties: on-resistance (mΩcm$^2$) |  | <1 |
|  | Reverse properties: leakage current (A/cm$^2$) |  | $2 \times 10^{-9}$ |

From Tables 1 to 9, it is understood that the semiconductor device (Schottky barrier diode) using the laminated body of the invention has a significantly small forward on-resistance. Further, it is understood that the leakage current in reverse direction was significantly small.

INDUSTRIAL APPLICABILITY

The laminated body of the invention can be used in a semiconductor device such as a power semiconductor device, a diode device, a Schottky barrier diode device or the like, and an electric circuit using this device can be used in an electric apparatus, an electronic apparatus, an electric vehicle or the like.

Although only some exemplary embodiments and/or examples of this invention have been described in detail above, those skilled in the art will readily appreciate that many modifications are possible in the exemplary embodiments and/or examples without materially departing from the novel teachings and advantages of this invention. Accordingly, all such modifications are intended to be included within the scope of this invention.

The specification of the Japanese patent applications claiming the priority under the Paris Convention to the invention is incorporated herein by reference in its entirety.

The invention claimed is:

1. A laminated body comprising a substrate, an ohmic electrode layer, a metal oxide semiconductor layer, a Schottky electrode layer and a buffer electrode layer in this order, wherein
a reduction suppressing layer is provided between the Schottky electrode layer and the buffer electrode layer.

2. The laminated body according to claim 1, wherein the reduction suppressing layer comprises one or more elements selected from the group consisting of Pd, Mo, Pt, Ir, Ru, Au, Ni, W, Cr, Re, Te, Tc, Mn, Os, Fe, Rh and Co.

3. The laminated body according to claim 1, wherein the Schottky electrode layer comprises an oxide of one or more metal elements having a work function of 4.4 eV or more.

4. The laminated body according to claim 1, wherein the Schottky electrode layer comprises an oxide of one or more metals selected from the group consisting of Pd, Mo, Pt, Ir, Ru, Ni, W, Cr, Re, Te, Tc, Mn, Os, Fe, Rh and Co.

5. The laminated body according to claim 1, wherein the substrate is a conductive substrate.

6. The laminated body according to claim 1, wherein the substrate is an insulating substrate.

7. The laminated body according to claim 1, wherein the substrate is a semiconductor substrate.

8. The laminated body according to claim 1, which comprises a layer structure comprising one or more layers selected from the group consisting of an electrode layer and an insulating layer.

9. The laminated body according to claim 1, wherein the substrate is a conductive silicon substrate.

10. The laminated body according to claim 1, wherein the metal oxide semiconductor layer comprises one or more elements selected from the group consisting of In, Ga, Zn and Sn.

11. The laminated body according to claim 1, wherein the hydrogen atom concentration of the metal oxide semiconductor layer is $10^{17}/cm^3$ or more and $10^{22}/cm^3$ or less.

12. The laminated body according to claim 1, wherein an outer edge of the metal oxide semiconductor layer is positioned on the same position as the position of an outer edge of the ohmic electrode layer or is positioned on the inside of an outer edge of the ohmic electrode layer, and the ohmic electrode layer is in contact with an entire lower surface of the metal oxide semiconductor layer.

13. The laminated body according to claim 1, wherein an outer edge of the Schottky electrode layer is positioned on the same position as the position of an outer edge of the metal oxide semiconductor layer or is positioned on the inside of an outer edge of the metal oxide semiconductor layer.

14. A semiconductor device wherein the laminated body according to claim 1 is used.

15. A Schottky barrier diode wherein the semiconductor device according to claim 14 is used.

16. A junction transistor wherein the semiconductor device according to claim 14 is used.

17. An electronic circuit wherein the semiconductor device according to claim 14 is used.

18. An electric apparatus, an electronic apparatus, a vehicle or power engine wherein the electronic circuit according to claim 17 is used.

19. An electronic circuit wherein the Schottky barrier diode according to claim 15 is used.

20. An electric apparatus, an electronic apparatus, a vehicle or power engine wherein the electronic circuit according to claim 19 is used.

21. An electronic circuit wherein the junction transistor according to claim 16 is used.

22. An electric apparatus, an electronic apparatus, a vehicle or power engine wherein the electronic circuit according to claim 21 is used.

* * * * *